US012805270B2

(12) United States Patent
Kusumi

(10) Patent No.: US 12,805,270 B2
(45) Date of Patent: Nov. 17, 2026

(54) SEMICONDUCTOR DEVICE

(71) Applicant: Socionext Inc., Kanagawa (JP)

(72) Inventor: Kosuke Kusumi, Yokohama (JP)

(73) Assignee: SOCIONEXT INC., Kanagawa (JP)

(*) Notice: Subject to any disclaimer, the term of this patent is extended or adjusted under 35 U.S.C. 154(b) by 357 days.

(21) Appl. No.: 18/442,973

(22) Filed: Feb. 15, 2024

(65) Prior Publication Data

US 2024/0194543 A1 Jun. 13, 2024

Related U.S. Application Data

(63) Continuation of application No. PCT/JP2021/030664, filed on Aug. 20, 2021.

(51) Int. Cl.
*H10P 74/00* (2026.01)
*H10W 20/42* (2026.01)
(Continued)

(52) U.S. Cl.
CPC ........... *H10P 74/277* (2026.01); *H10W 20/42* (2026.01); *H10W 20/43* (2026.01);
(Continued)

(58) Field of Classification Search
CPC ..... H10P 74/277; H10W 20/42; H10W 20/43; H10W 70/611; H10W 70/685;
(Continued)

(56) References Cited

U.S. PATENT DOCUMENTS 5,754,410 A 5/1998 Bardsley et al.
7,250,311 B2 7/2007 Aoki et al.
(Continued)

FOREIGN PATENT DOCUMENTS

JP H10-104322 A 4/1998
JP 2002-228725 A 8/2002
(Continued)

OTHER PUBLICATIONS

International Search Report dated Nov. 16, 2021 issued in International Patent Application No. PCT/JP2021/030664, with English translation.
Written Opinion of the International Searching Authority dated Nov. 16, 2021 issued in International Patent Application No. PCT/JP2021/030664, with English translation.

*Primary Examiner* — Tucker J Wright
(74) *Attorney, Agent, or Firm* — Rimon P.C.

(57) ABSTRACT

A semiconductor device includes a substrate; and a plurality of semiconductor elements each including a first terminal and a second terminal connected to the substrate, and an internal wiring connecting the first terminal and the second terminal to each other. A wiring path is provided to sequentially connect the plurality of semiconductor elements, by connecting the first terminal of each of the plurality of semiconductor elements to the second terminal of another one of the plurality of semiconductor elements via a substrate wiring provided in the substrate. One of the plurality of semiconductor elements includes a determination circuit provided on a path of the internal wiring. The determination circuit is configured to transmit a determination signal to the first terminal, and determine an abnormality of the wiring path based on the determination signal received by the second terminal via the wiring path.

9 Claims, 8 Drawing Sheets

(51) Int. Cl.

| | |
|---|---|
| ***H10W 20/43*** | (2026.01) |
| ***H10W 70/60*** | (2026.01) |
| ***H10W 70/685*** | (2026.01) |
| ***H10W 90/00*** | (2026.01) |
| *H10W 74/15* | (2026.01) |

(52) U.S. Cl.
CPC ........ *H10W 70/611* (2026.01); *H10W 70/685* (2026.01); *H10W 90/00* (2026.01); *H10W 74/15* (2026.01); *H10W 90/724* (2026.01); *H10W 90/734* (2026.01)

(58) Field of Classification Search
CPC ... H10W 90/00; H10W 74/15; H10W 90/724; H10W 90/734; H10W 72/851; H10W 72/30; H10W 20/01; H10W 20/40; H10W 72/20
See application file for complete search history.

(56) References Cited

U.S. PATENT DOCUMENTS

| | | | | |
|---|---|---|---|---|
| 9,153,508 | B2 | 10/2015 | Partsch | |
| 10,147,657 | B2 | 12/2018 | Ilkov | |
| 10,908,210 | B2 | 2/2021 | Periyannan et al. | |
| 2014/0091819 | A1 | 4/2014 | Gong et al. | |
| 2021/0156904 | A1* | 5/2021 | Lim .................. | G01R 31/2803 |

FOREIGN PATENT DOCUMENTS

| | | | |
|---|---|---|---|
| JP | 2004-150813 | A | 5/2004 |
| JP | 2007-155444 | A | 6/2007 |
| JP | 2011-023516 | A | 2/2011 |
| JP | 2015-532420 | A | 11/2015 |

* cited by examiner

SEMICONDUCTOR DEVICE

CROSS-REFERENCE TO RELATED APPLICATION

The present application is a continuation application of International Application No. PCT/JP2021/030664 filed on Aug. 20, 2021, the contents of which are incorporated herein by reference in their entirety.

TECHNICAL FIELD

The present invention relates to a semiconductor device.

BACKGROUND ART

There is known method for detecting peeling or cracking between insulating layers of a semiconductor chip by measuring the conduction of a wiring monitor such as a via chain provided on the outer periphery of the semiconductor chip. A multi-chip package in which multiple semiconductor chips are mounted on an interposer is known. In the interposer, there is known a technique for detecting a connection failure between the interposer and a microbump by measuring the conduction of a wiring chain connecting the wiring layers.

RELATED ART DOCUMENTS

Patent Documents

[Patent Document 1] Japanese Translation of PCT International Application Publication No. JP-T-2015-532420

[Patent Document 2] Japanese Unexamined Patent Application Publication No. 2011-23516

[Patent Document 3] U.S. Pat. No. 7,250,311

[Patent Document 4] U.S. Pat. No. 10,147,657

[Patent Document 5] U.S. Pat. No. 10,908,210

[Patent Document 6] U.S. Pat. No. 9,153,508

For example, it is conceivable that each of a plurality of semiconductor chips mounted in a multi-chip package is provided with a determination circuit for determining a connection failure with an interposer, and that a connection failure between each semiconductor chip and the interposer is determined individually. However, in this case, the chip size of each semiconductor chip increases, and the cost of the multi-chip package increases.

SUMMARY

According to one aspect of the present invention, a semiconductor device includes a substrate; and a plurality of semiconductor elements each including a first terminal and a second terminal connected to the substrate, and an internal wiring connecting the first terminal and the second terminal to each other, wherein a wiring path is provided to sequentially connect the plurality of semiconductor elements, by connecting the first terminal of each of the plurality of semiconductor elements to the second terminal of another one of the plurality of semiconductor elements via a substrate wiring provided in the substrate, one of the plurality of semiconductor elements includes a determination circuit provided on a path of the internal wiring, and the determination circuit is configured to transmit a determination signal to the first terminal, and determine an abnormality of the wiring path based on the determination signal received by the second terminal via the wiring path.

EMBODIMENTS OF THE INVENTION

Hereinafter, the embodiment will be described with reference to the drawings.

According to the disclosed technology, in a semiconductor device in which a plurality of semiconductor elements are mounted on a substrate, it is possible to detect a connection failure of the plurality of semiconductor elements while preventing an increase in cost.

First Embodiment

Figure 1:
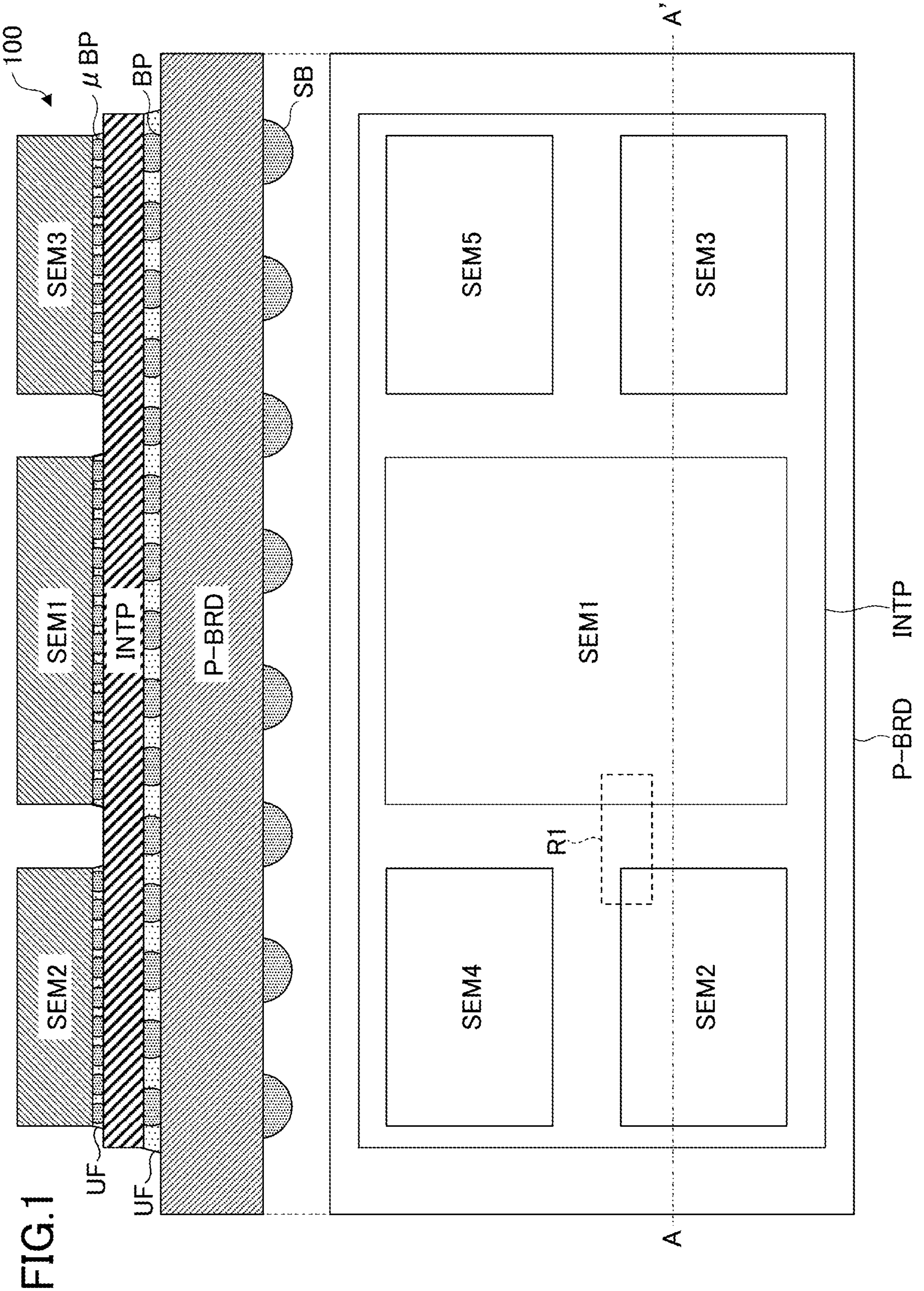
FIG. 1 is a block diagram illustrating an example of a semiconductor device according to a first embodiment.

FIG. 1 illustrates an example of a semiconductor device according to the first embodiment. A semiconductor device 100 illustrated in FIG. 1 has a plurality of semiconductor chips SEM1, SEM2, SEM3, SEM4, SEM5, an interposer INTP, and a package substrate P-BRD. The semiconductor device 100 has what is referred to as a 2.5D package configuration in which a plurality of semiconductor chips SEM1 to SEM5 are interconnected via an interposer INTP. The semiconductor chips SEM1 to SEM5 are examples of semiconductor elements. The interposer INTP is an example of a substrate.

The cross-sectional structure of FIG. 1 illustrates a cross-section along line A-A' of FIG. 1. In the following, the semiconductor chips SEM1 to SEM5 are also referred to simply as the chips SEM1 to SEM5. When the chips SEM1 to SEM5 are described without being distinguished from each other, these are also referred to as the chip SEM.

For example, each chip SEM may be any one of an SoC (System on a Chip), an ASIC (Application Specific Integrated Circuit), a CPU (Central Processing Unit), a memory, etc. Each chip SEM is connected to the interposer INTP via microbumps μBP. An underfill UF may be provided between each chip SEM and the interposer INTP, covering the microbumps μBP.

For example, the microbumps μBP are formed by mutually joining the microbumps provided on the surface of each chip SEM facing the interposer INTP and the microbumps provided on the surface of the interposer INTP facing each chip SEM. The bumps connecting each chip SEM and the interposer INTP are not limited to the microbumps μBP.

The interposer INTP is connected to the package substrate P-BRD via bumps BP. The underfill UF may be provided between the interposer INTP and the package substrate P-BRD, covering the bumps BP. The semiconductor device 100 is connected to a system substrate or the like (not illustrated) via a solder ball SB provided on the package substrate P-BRD. The broken line frame R1 is used in the description of FIG. 2.

Although not particularly limited, the semiconductor device 100 may function as an image processing apparatus for processing images taken by a camera. For example, the semiconductor device 100 functioning as an image processing apparatus may be mounted on a mobile object such as an automobile. The semiconductor device 100 may be mounted on a system substrate of a portable terminal such as a smartphone.

Figure 2:
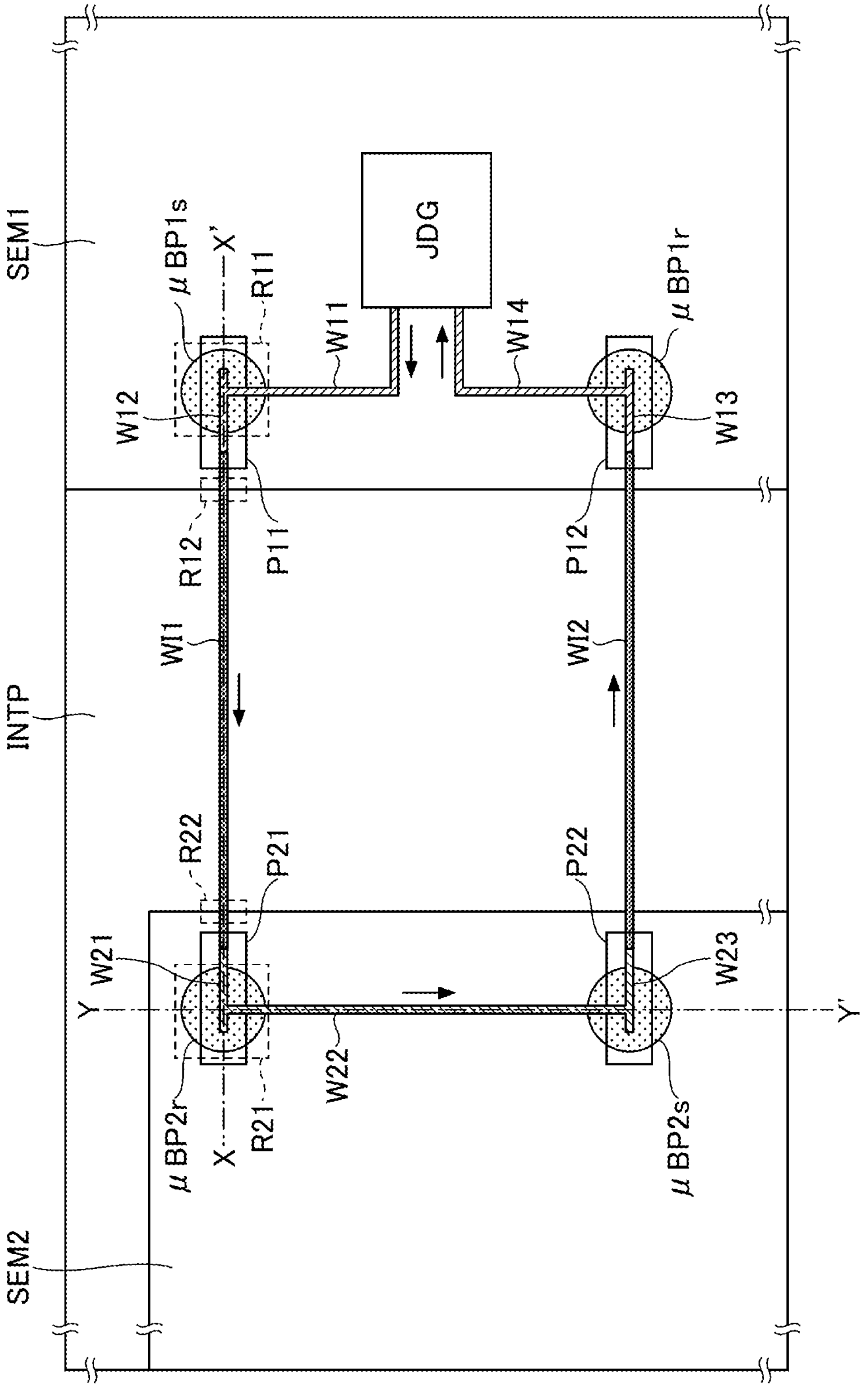
FIG. 2 is an explanatory diagram illustrating an outline of a detection mechanism for detecting a connection failure between chips in FIG. 1.

FIG. 2 illustrates an outline of a detection mechanism for detecting a connection failure between chips in FIG. 1. FIG. 2 illustrates the portion of the broken line frame R1 extending over the chips SEM1 and SEM2 in the plan view of FIG. 1. FIG. 2 illustrates a planar view from the side of the chips SEM1 and SEM2 to the side of the interposer INTP of FIG. 1, but some elements such as micro-bumps, pads, and wiring are made transparent.

The chip SEM1 has a determination circuit JDG for determining a disconnection failure. The determination circuit JDG transmits a determination signal for determining a disconnection failure to the chip SEM2 and receives a determination signal transmitted through the chip SEM2. An arrow illustrated beside each wiring in FIG. 2 indicates the transmission direction of the determination signal.

Although not illustrated, the determination circuit JDG includes, for example, a buffer circuit for outputting a high-level determination signal to the wiring W11 and a pull-down resistor connected to the wiring W14. The determination circuit JDG also includes a detection circuit for detecting the logical level (that is, the voltage level) of the determination signal returned from the chip SEM2 to the wiring W14. For example, the resistance value of the pull-down resistance is set so that the detection circuit detects, as a high level, a divided voltage resulting from the pressure division between the resistance of the wiring path and the pull-down resistance, when there is no abnormality in the wiring path through which the determination signal is transmitted.

The determination circuit JDG then determines that the wiring path through which the determination signal is transmitted is normal when, for example, the detection circuit detects a high level determination signal while the semiconductor device 100 of FIG. 1 is operating as a system. On the other hand, the determination circuit JDG determines that an abnormality such as disconnection has occurred in the wiring path through which the determination signal is transmitted when the detection circuit detects a low level determination signal while the semiconductor device 100 is operating as a system. Even when the wiring path is not completely disconnected, the determination circuit JDG can detect an abnormality in the wiring path due to a decrease in the divided voltage caused by an increase in the resistance value of the wiring path.

When the determination circuit JDG determines the disconnection, the determination circuit JDG reports the occurrence of the abnormality to the system controller mounted on the system substrate together with the package substrate P-BRD illustrated in FIG. 1. The determination of the disconnection by the determination circuit JDG may be performed when the semiconductor device 100 has stopped the system operation.

In FIG. 2, the rectangular regions R11, R12, R21, and R22 indicated by the dashed lines indicate places where stress is easily concentrated, and places where peeling or cracking of the wiring layer is more likely to occur than other places when a predetermined amount of stress is applied. For example, at the corner of the chip SEM2, stress is easily concentrated. Further, at the chip SEM1, at the part facing the corner of the chip SEM2 through the interposer INTP in a planar view, stress is also easily concentrated.

The output terminal (not illustrated) which outputs the determination signal to the wiring W11 in the determination circuit JDG, is connected to the wiring W12, the via (not illustrated), and the pad P11 provided in the region R11 of the chip SEM1 through the wiring W11. The pad P11 is connected to the microbump μBP1*s* for transmission. The microbump μBP1*s* is connected to the wiring WI1 of the interposer INTP via a pad, a via, and a wiring (not illustrated) provided in the region R12 of the interposer INTP.

The wiring WI1 of the interposer INTP is connected to a via, a wiring, and a pad (not illustrated) provided in the region R22 of the interposer INTP facing the corner of the chip SEM2 in a planar view. The pad (not illustrated) of the interposer INTP is connected to the microbump μBP2*r* for reception. The microbump μBP2*r* is connected to the wiring W22 through the pad P21, the via (not illustrated), and the wiring W21 provided in the region R21 of the chip SEM2. The microbumps μBP1*s* and μBP2*r* provided adjacent to the regions R11 and R21 function as bumps for detecting peeling.

The wiring W22 is connected to the microbump μBP2*s* for transmission via a via (not illustrated), a wiring W23, and a pad P22 in the chip SEM2. The microbump μBP2*s* is connected to the wiring WI2 of the interposer INTP via a pad, a via, and a wiring (not illustrated) in the interposer INTP. The wiring WI2 is connected to the microbump μBP1*r* for reception via a via, a wiring, and a pad (not illustrated) in the interposer INTP at a position facing the end of the chip SEM1 in a planar view. The microbump μBP1*r* is connected to the receiving terminal of the determination circuit JDG via the pad P12, the via, and the wirings W13, W14 in the chip SEM1.

The microbumps μBP1*s* and μBP2*s* for transmitting the determination signal are examples of first terminals. The microbumps μBP1*r* and μBP2*r* for receiving the determination signal are examples of second terminals. The wirings W11, W12, W13, and W14 are examples of internal wirings provided in the chip SEM1. The wiring W12 is an example of a first wiring, the wiring W13 is an example of a second wiring, and the wirings W11 and W14 are examples of third wirings. In the following, when microbumps μBP1*s*, μBP1*r*, μBP2*s*, and μBP2*r* are described without being distinguished from each other, these are also referred to as the microbump μBP.

The wirings W21, W22, and W23 are examples of internal wirings provided in the chip SEM2. The wiring W23 is an example of a first wiring, the wiring W21 is an example of a second wiring, and the wiring W22 is an example of a third wiring. The wirings WI1 and WI2 are examples of substrate wirings provided in the interposer INTP, and these are examples of sixth wirings.

Figure 8:
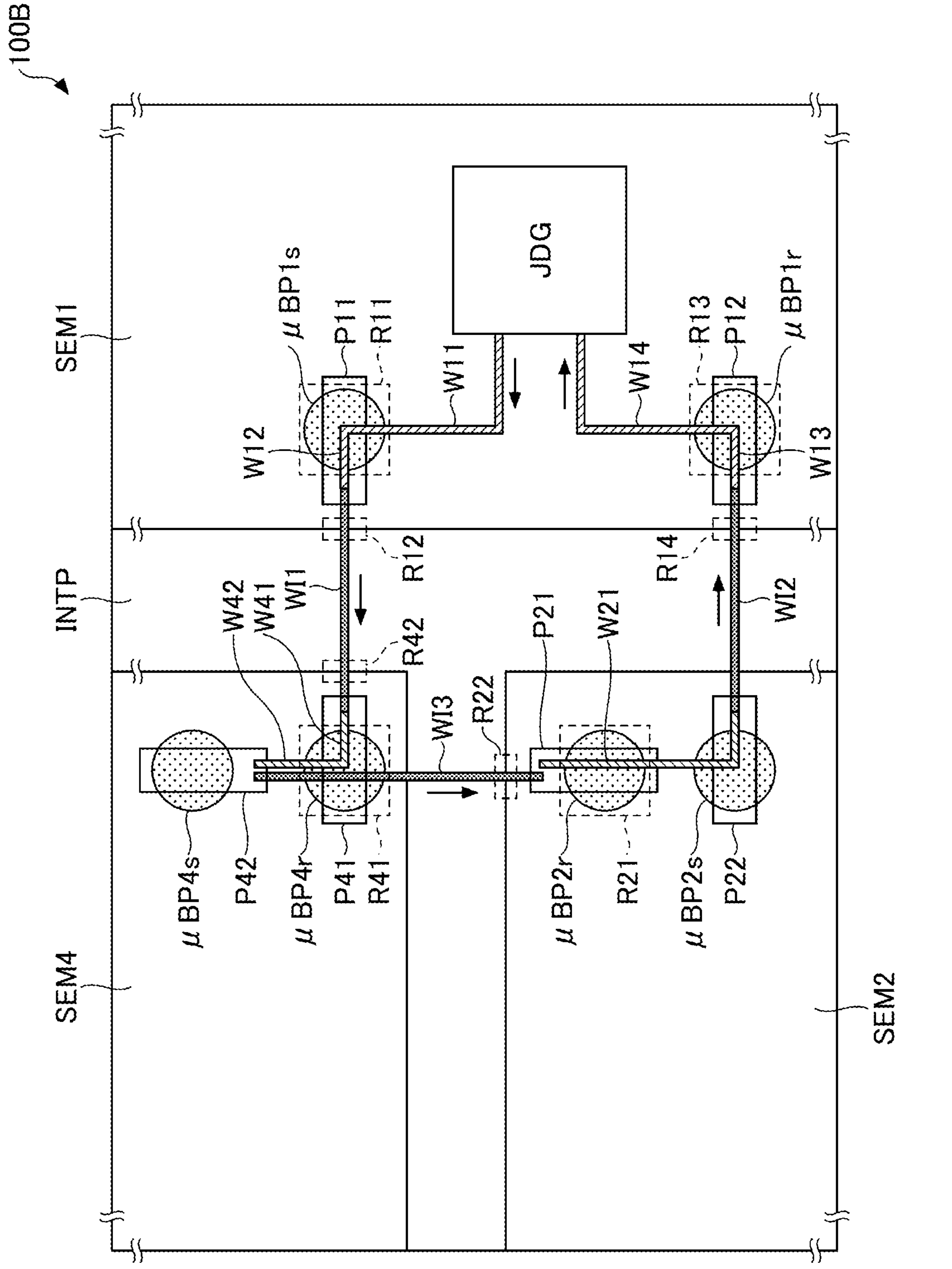
FIG. 8 is a block diagram illustrating an example of a semiconductor device according to a third embodiment.

The electrically sequentially connected wirings W11, W12, WI1, W21, W22, W23, WI2, W13, and W14 are examples of wiring paths for sequentially connecting the chips SEM1 and SEM2. The determination circuit JDG is provided on the paths of the wirings W11 and W14 of the chip SEM1. As illustrated in FIG. 8, which will be described later, three or more chips SEM may be connected sequentially by the wiring paths.

Figure 3:
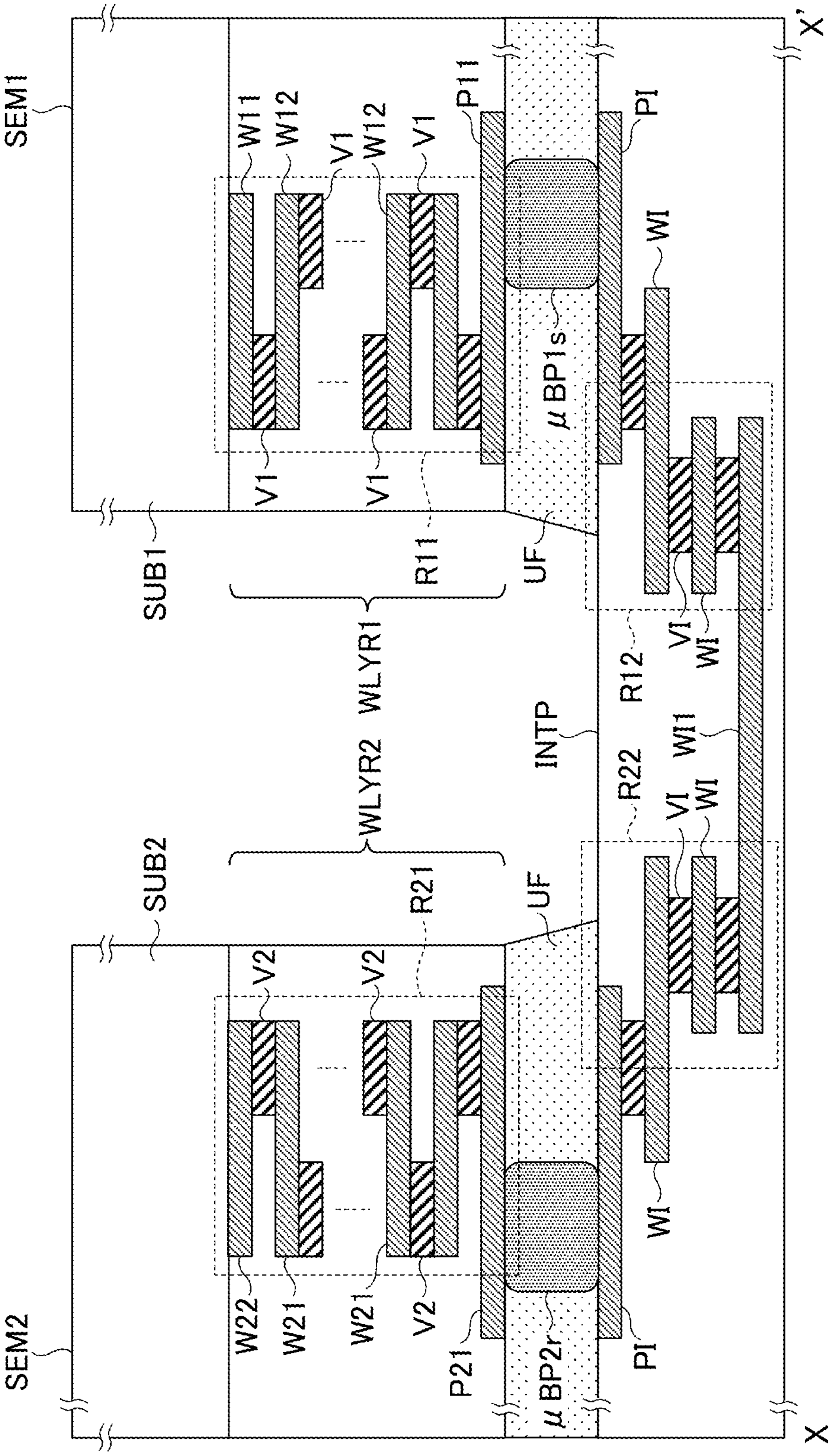
FIG. 3 is a cross-sectional view illustrating a cross section along the X-X' line in FIG. 2.

FIG. 3 illustrates a cross section along the X-X' line of FIG. 2. The chip SEM1 has a wiring region WLYR1 and a substrate SUB1. For example, the substrate SUB1 is a semiconductor substrate such as silicon on which transistors and the like are formed, and has transistors and the like included in the determination circuit JDG illustrated in FIG. 2.

The wiring region WLYR1 includes a plurality of wiring layers and insulating layers provided between adjacent wiring layers. A via V1 connecting the wirings provided in adjacent wiring layers can be formed in the insulating layer. In the wiring region WLYR1, the via V1 and the wiring W12 are repeatedly arranged from the pad P11 provided in the chip SEM1 to the wiring W11 on the substrate SUB1 side in the region R11 where stress is easily applied. The wiring layer in which the wiring W11 and the wiring W12 are arranged is an example of an element wiring layer.

For example, the wiring W11 and the wiring W12 for transmitting a determination signal are provided by using all the wiring layers of the wiring region WLYR1. The via V1 and the wiring W12 have a meandering shape in a cross-sectional view. The wiring W11 is electrically connected to the microbump μBP1*s* via the meandering shaped via V1 and the wiring W12. The meandering shaped via V1 and the wiring W12 may be provided only on a predetermined number of insulating layers and wiring layers on the side of the microbump μBP1*s*. For example, the predetermined number may be ½ or ⅓ of the total number of wiring layers provided in the wiring region WLYR1.

The chip SEM2 has a wiring region WLYR2 and a substrate SUB2. For example, the substrate SUB2 is a semiconductor substrate such as silicon. The wiring region WLYR2 includes a plurality of wiring layers and insulating layers provided between adjacent wiring layers. In the insulating layer, a via V2 for connecting wirings provided in adjacent wiring layers can be formed. In the wiring region WLYR2, the via V2 and the wiring W21 are repeatedly arranged from the pad P21 provided in the chip SEM2 to the wiring W22 on the substrate SUB2 side, in the region R21 where stress is likely to be applied. The wiring layer in which the wirings W21 and W22 are arranged is an example of an element wiring layer.

For example, the wirings W22 and W21 for transmitting a determination signal are provided by using all the wiring layers of the wiring region WLYR2. The via V2 and the wiring W21 have a meandering shape in cross-sectional view. The wiring W22 is electrically connected to the microbump μBP2*r* via the meandering shaped via V2 and the wiring W21. The meandering shaped via V2 and the wiring W21 may be provided only in a predetermined number of wiring layers on the microbump μBP2*r* side.

In FIG. 3, the wiring W11 is provided in the wiring layer closest to the substrate SUB1, and the wiring W22 is provided in the wiring layer closest to the substrate SUB2. However, the wiring W11 may be provided in a wiring layer other than the wiring layer closest to the substrate SUB1, and may be connected to the substrate SUB1 through another wiring layer on the substrate SUB1 side. The wiring W22 may be provided in a wiring layer other than the wiring layer closest to the substrate SUB2, and may be connected to the substrate SUB2 through another wiring layer on the substrate SUB2 side. The wiring W11 may be embedded in the surface of the substrate SUB1 on the side of the wiring region WLYR1, and the wiring W22 may be embedded in the surface of the substrate SUB2 on the side of the wiring region WLYR2.

In the interposer INTP, the via VI and the wiring WI are repeatedly arranged in each of the regions R12 and R22 from the pad PI provided in the interposer INTP to the wiring WI1. For example, the via VI and the wirings WI and WI1 are provided by using all the wiring layers of the interposer INTP.

The wiring WI may be provided only in a predetermined number of wiring layers on the side of the microbumps μBP1*s* and μBP2*r*. The wiring layer in which the wirings WI and WI1 are arranged is an example of a substrate wiring layer. The wiring WI arranged on the side of the microbump μBP1*s* is an example of a fourth wiring. The wiring WI arranged on the side of the microbump μBP2*r* is an example of a fifth wiring. The wiring WI1 is an example of a sixth wiring.

Although not illustrated, a passivation film may be provided on the surface of the chip SEM1 on the side of the microbump μBP1*s*, except for the exposed portion of the pad P11. Similarly, a passivation film may be provided on the surface of the chip SEM2 on the side of the microbump μBP2*r*, except for the exposed portion of the pad P21. A passivation film may be provided on the surface of the interposer INTP on the side of the microbumps μBP1*s* and μBP2*r*, except for the exposed portion of the pad PI.

In the present embodiment, the via V1 and the wirings W11 and W12 are arranged in a meandering shape in cross-sectional view by using a plurality of wiring layers in the stress-sensitive region R11, so that it is easy to determine the disconnection of a wiring path that transmits a determination signal not used for the system operation. Similarly, in the region R21 susceptible to stress, the via V2 and the wirings W22 and W21 are arranged in a meandering shape in a cross-sectional view by using a plurality of wiring layers, so that the disconnection of the wiring path for transmitting the determination signal can be easily determined. This is because the wiring in the meandering shape is more likely to be disconnected than the wiring without the meandering shape used for the operation of the system.

Examples of disconnection include the peeling of the wirings W11 and W12 from the via V1, the peeling of the wirings W22 and W21 from the via V2, and the cracking of the wirings W11, W12, W22 and W21. Examples of disconnection include the cracking of the insulating layer (interlayer insulating film) of the wiring regions WLYR1 and WLYR2.

In the interposer INTP, by arranging the via VI and the wiring WI by using a plurality of wiring layers in the regions R12 and R22 that are susceptible to stress, it is possible to easily determine the disconnection of a wiring path that transmits a determination signal not used for the system operation. For example, the wiring structure of the transmission path of the determination signal in regions other than the regions R11 and R21 that are susceptible to stress concentration may be the same as the wiring structure of the transmission path of the signal used for the system operation.

Thus, the determination circuit JDG can detect the disconnection of the wiring or the like that transmits the determination signal before the wiring or the like used for the system operation in the chips SEM1, SEM2, or the interposer INTP is disconnected. That is, the semiconductor device 100 can detect signs of disconnection in the wiring or the like used for the system operation in the chip SEM1, SEM2 or interposer INTP. As a result, the semiconductor device 100 can safely stop the system operation based on the determination of disconnection by the determination circuit JDG. That is, the degradation of reliability of the semiconductor device 100 can be prevented by the determination circuit JDG.

Figure 4:
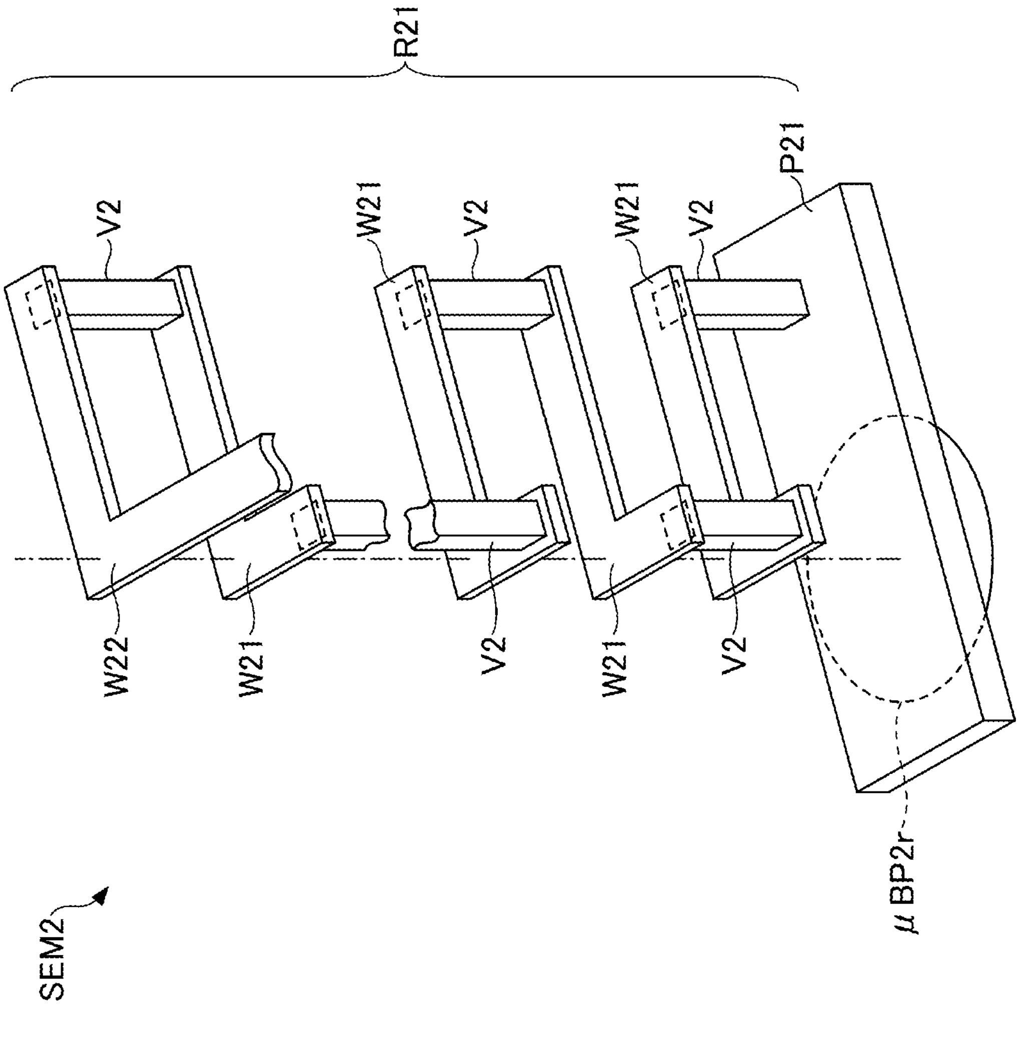
FIG. 4 is a perspective view illustrating an example of the wiring structure of the region R21 in FIG. 3.

FIG. 4 illustrates an example of the wiring structure of the region R21 in FIG. 3. As illustrated in FIG. 4, the wirings W22 and W21 have L-shapes that substantially overlap each other in a planar view (L-shape wiring). The L-shaped bent portion of the wirings W22 and W21 is located approximately at the center of the microbump μBP2*r* in a planar view. The vias V2 are alternately shifted in position from each other in a planar view. Further, the vias V2 are provided at positions substantially overlapping each other in a planar view at one end and the other end of the wiring W21. By alternately shifting the positions of the vias V2 in a planar view, the occurrence of film peeling due to stress can be easily detected, compared with the case where the positions of the vias in a planar view are the same.

Each wiring W21 is connected to the via V2 located on the side of the wiring W22 at one end of the L-shape, and is connected to the via V2 located on the side of the pad P21 at the other end of the L-shape. Note that the via V2 may be provided at one end and the other end of the wiring W21 at positions that are shifted from each other in a planar view.

The wiring structure of the region R11 in FIG. 3 is also the same as that in FIG. 4. That is, the wirings W11 and W12 in FIG. 3 have an L-shape that substantially overlap each other in a planar view, and the bent portion of the L-shape is located approximately at the center of the microbump μBP1*s* in a planar view. The vias V1 are provided at one end and the other end of the wiring W12 at positions that substantially overlap each other in a planar view. Each wiring W12 is connected to the via V1 located on the side of the wiring W11 at one end of the L-shape and is connected to the via V1 located on the side of the pad P11 at the other end of the L-shape. That is, the vias V1 connected to each wiring W12 are alternately shifted in position in a planar view.

With the wiring structure illustrated in FIG. 4, it is possible to make the connection portions between the wirings W22 and W21 and the via V2 susceptible to the stress applied to the chip SEM2. Therefore, it is possible to detect the film peeling of the wirings W22 and W21, which are provided at positions overlapping the microbump μBP2*r* in a planar view, as a disconnection, by the determination circuit JDG. Furthermore, the peeling of the microbump μBP2*r* and the pad P21 can be detected as a disconnection by the determination circuit JDG.

Further, by making each of the wirings W22 and W21 have an L-shape with the bent portion facing the microbump μBP2*r*, a disconnection can be detected sensitively regardless of the direction of film peeling. In the wiring structure of the region R11 illustrated in FIG. 3, the same effect as that of the wiring structure of the region R21 can be obtained.

Figure 5:
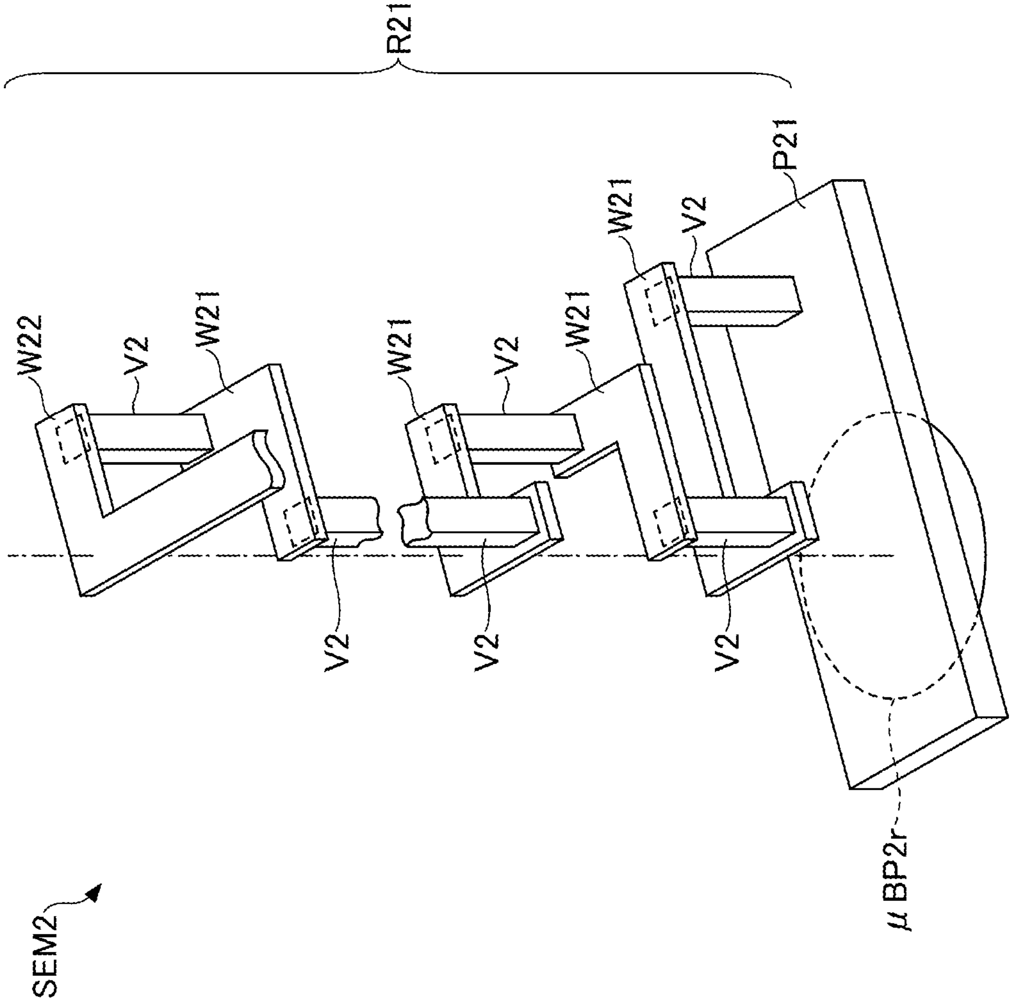
FIG. 5 is a perspective view illustrating another example of the wiring structure of the region R21 in FIG. 3.

FIG. 5 illustrates another example of the wiring structure of the region R21 illustrated in FIG. 3. Also illustrated in FIG. 5, the wirings W22 and W21 have an L-shape. However, in FIG. 5, the transmission path of the determination signal by the wirings W22 and W21 and the via V2 has a spiral shape. A part of the L-shaped wirings W22 and W21 overlaps the microbump μBP2*r* in a planar view.

In FIG. 5, the vias V2 may be provided in the same position in a planar view at one end and the other end of the L-shaped wiring W21, or may be provided at positions that are shifted from each other. The L-shaped wiring W21 may be arranged so that at least a part of the wiring W21 overlaps the microbump μBP2*r* in a planar view.

In the wiring structure illustrated in FIG. 5, an effect similar to that of the wiring structure illustrated in FIG. 4 can be obtained. The wiring structure of the region R11 illustrated in FIG. 3 may be the same as that of the wiring structure illustrated in FIG. 5. Note that the wiring structure of the region R21 illustrated in FIG. 3 is not limited to the wiring structure illustrated in FIGS. 4 and 5.

Figure 6:
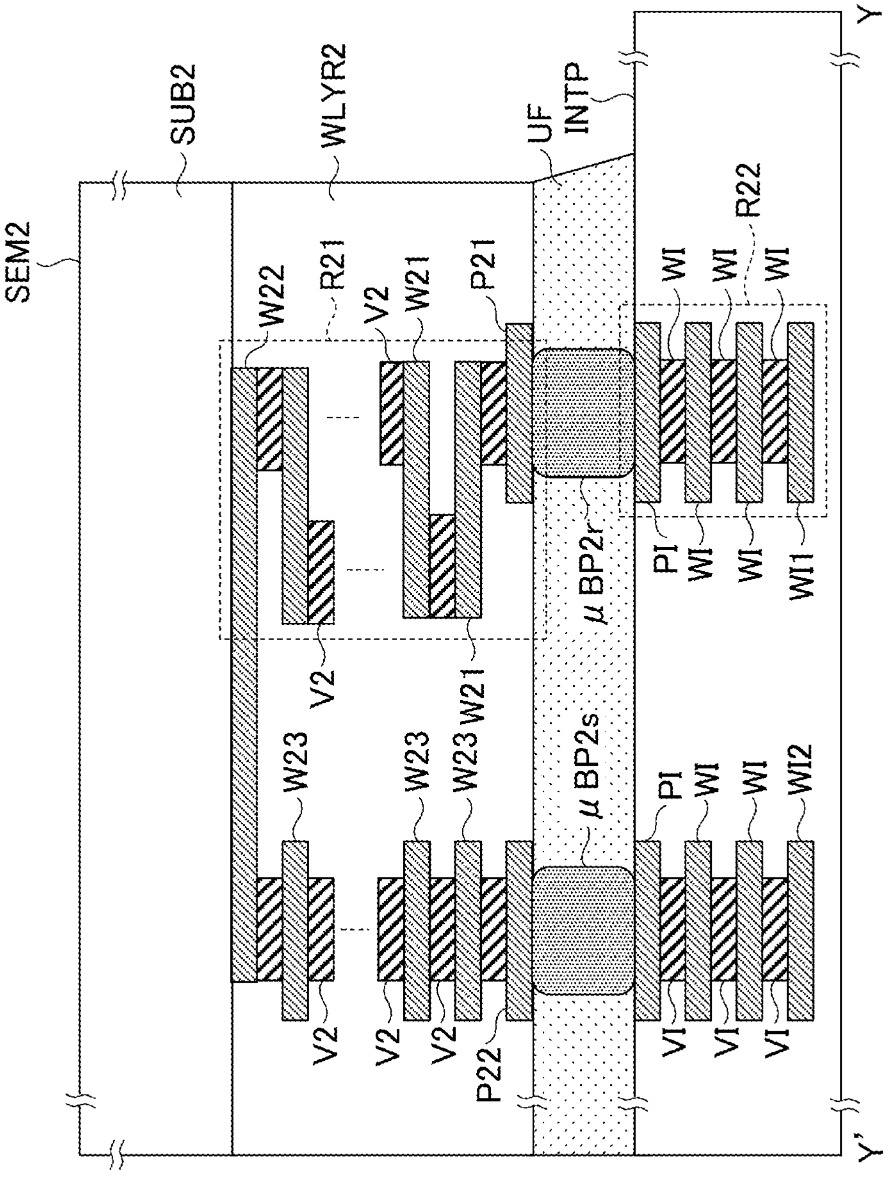
FIG. 6 is a cross-sectional view illustrating a cross section along the Y-Y' line in FIG. 2.

FIG. 6 illustrates a cross section along the Y-Y' line illustrated in FIG. 2. The wiring structures of the regions R21 and R22 have been described in FIGS. 3 to 5, and, therefore, a description thereof will be omitted. The wirings W22 and W23 facing the microbump μBP2*s* in the wiring region WLYR2 in a planar view have a rectangular shape similar to the wiring structure of the region R22 of the interposer INTP, for example.

In the present embodiment, the determination circuit JDG common to the plurality of chips SEM1 and SEM2 is provided only on the chip SEM1. Further, wiring paths for returning the determination signal output from the determination circuit JDG to the determination circuit JDG via the chip SEM2 are provided on the chips SEM1, SEM2, and the interposer INTP, respectively. As a result, failures such as disconnection occurring on the plurality of chips SEM1, SEM2, and the interposer INTP can be determined by one determination circuit JDG. That is, in the semiconductor device 100 in which the plurality of semiconductor chips SEM are mounted on the interposer INTP, it is possible to detect a connection failure of the plurality of semiconductor chips SEM while preventing an increase in cost.

The determination signal is transmitted to the wirings and the vias connecting the wirings provided in the regions R11, R12, R21, and R22 susceptible to stress, in the respective chips SEM1, SEM2, and the interposer INTP. Therefore, failures such as film peeling occurring in the wiring layer can be more easily detected than failures such as film peeling occurring in other wiring layer regions.

For example, the wiring that transmits the determination signal is the wiring that is not used for the operation of the system. Therefore, the determination circuit JDG can detect the disconnection of the wiring or the like that transmits the determination signal before the wiring or the like used for the operation of the system in the chips SEM1, SEM2, or the interposer INTP is disconnected. That is, the semiconductor device 100 can detect a sign of disconnection of the wiring or the like used for the operation of the system in the chips SEM1, SEM2, or the interposer INTP. As a result, the semiconductor device 100 can safely stop the operation of the system based on the determination of the disconnection by the determination circuit JDG. Thus, the degradation of the reliability of the semiconductor device 100 can be prevented.

The wiring structure of the region R11 (or R21) in which the occurrence of film peeling or the like is easily detected is provided facing the microbump μBP. Therefore, the occurrence of film peeling or the like of the wiring in the vicinity of the microbump μBP in which the stress is easily applied in the chip SEM1 (or SEM2) can be easily detected.

By alternately shifting the positions of the vias V1 (or V2) in a planar view in the region R11 (or R21), it is possible to easily detect the occurrence of film peeling or the like caused by stress, compared to the case where the positions of the vias in a planar view are the same.

The wiring structure of the via V1 (or V2) and the wirings W11 and W12 (or W22, W21) using a plurality of wiring layers has a meandering shape in the sectional view. For example, the meandering shape in the sectional view is a repeating shape illustrated in FIG. 4 or a spiral shape illustrated in FIG. 5. Thus, the occurrence of film peeling or the like in response to the stress applied to the chip SEM1 (or SEM2), can be easily detected. In this case, for example, by providing the wiring structure illustrated in FIG. 4 or FIG. 5 at a position facing the microbump μBP2*r* provided at the corner of the chip SEM2, the occurrence of film peeling or the like of the wiring can be further easily detected.

By making the wiring provided in the regions R11 and R21 have an L-shape, it is possible to sensitively detect the disconnection regardless of the direction of film peeling. By arranging the L-shaped wirings W21 (or W12) at positions facing each other in a planar view, it is possible to facilitate the layout design of the chip SEM2 (or SEM1) in comparison with the case where the wirings are arranged at positions not facing each other in a planar view.

By making the wiring structure in the interposer INTP for interconnecting the chips SEM1 and SEM2, have a wiring structure created by the via VI and the wirings WI and WI2 by using a plurality of wiring layers, it is possible to easily detect film peeling or the like of the wiring of the interposer INTP.

Second Embodiment

Figure 7:
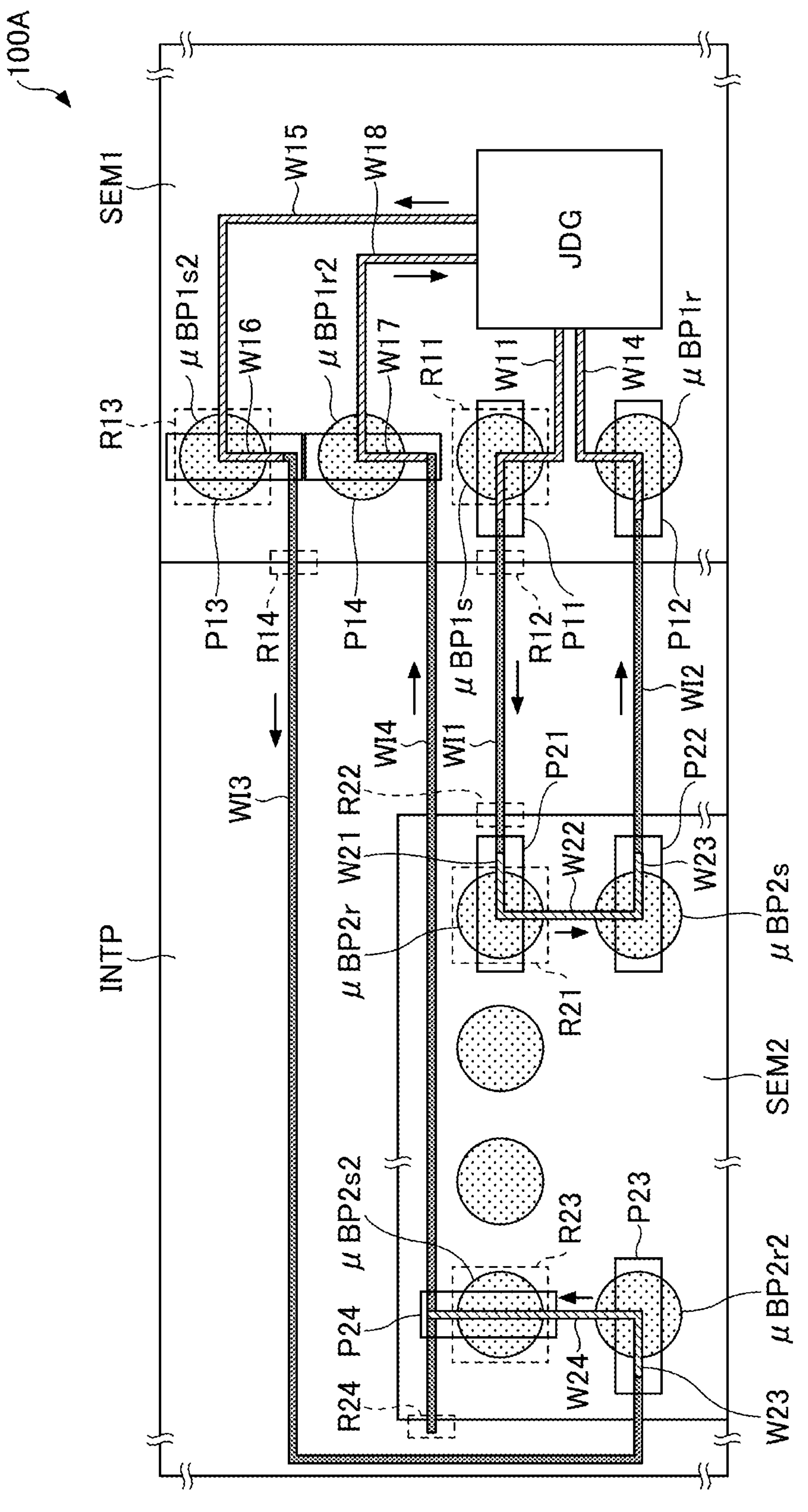
FIG. 7 is a block diagram illustrating an example of a semiconductor device according to a second embodiment.

FIG. 7 illustrates an example of a semiconductor device according to the second embodiment. Elements similar to those in the above-described embodiment are denoted by the same reference numerals, and detailed descriptions thereof are omitted. In FIG. 7, as in FIG. 2, some elements such as microbumps, pads, and wiring are made transparent.

The semiconductor chips SEM1 and SEM2 illustrated in FIG. 7 are connected to each other via the interposer INTP as in FIG. 1 and are mounted on a semiconductor device 100A having a 2.5D package configuration. The mounting positions of the semiconductor chips SEM1 and SEM2 on the interposer INTP are the same as the mounting positions of the semiconductor chips SEM1 and SEM2 on the interposer INTP of the semiconductor device 100 illustrated in FIG. 1.

In the present embodiment, for example, the determination circuit JDG can detect a disconnection or the like of the regions R21, R22, R23, and R24 adjacent to the microbumps μBP2*r*, μBP2*s*2 provided at the two corners among the four corners of the rectangular chip SEM2. The wiring structure of the transmission path of the determination signal transmitted from the determination circuit JDG and returning to the determination circuit JDG via the microbumps μBP1*s*, μBP2*r*, μBP2*s*, and μBP1*r* is similar to the wiring structure illustrated in FIGS. 2 to 6.

The microbump μBP2*s*2 is provided at a position opposite to the chip SEM1 in a planar view in the chip SEM2. The semiconductor device 100A has a transmission path of a determination signal transmitted from the determination circuit JDG and returning to the determination circuit JDG via the microbumps μBP1*s*2, μBP2*r*2, μBP2*s*2, and μBP1*r*2. Thus, the determination circuit JDG can detect the disconnection of the regions R23 and R24 adjacent to the microbump μBP2*s*2, which are provided at the corner of the chip SEM2 on the side further from the chip SEM1.

In addition to the configuration illustrated in FIG. 2, the determination circuit JDG has a buffer circuit for outputting the determination signal to the wiring W15, a pull-down circuit for pulling down the wiring W18, and a detection circuit for detecting the logical level of the determination signal returned from the chip SEM2 to the wiring W18. The determination signals output to the wiring W11 and the wiring W15 may be common.

An output terminal (not illustrated) for outputting a determination signal to the wiring W15 in the determination circuit JDG is connected to the wiring W16, a via (not illustrated), and the pad P13 provided in the region R13 of the chip SEM1 through the wiring W15 in the chip SEM1. The pad P13 is connected to the microbump μBP1*s*2 for transmission. The microbump μBP1*s*2 is connected to the wiring WI3 in the interposer INTP via a pad, a via, and a wiring (not illustrated) provided in the region R14 of the interposer INTP.

The wiring WI3 is connected to the microbump μBP2*r*2 for reception via a via, a wiring, and a pad (not illustrated) in the interposer INTP near the corner of the chip SEM2 on the opposite side of the chip SEM1. The microbump μBP2*r*2 is connected to the wiring W24 via the pad P23, a via (not illustrated), and the wiring W23 in the chip SEM2.

The wiring W24 is connected to the microbump μBP2*s*2 for transmission provided in the opposite corner of the chip SEM1 via a via, a wiring, and the pad P24 (not illustrated) provided in the region R23 of the chip SEM2. The microbump μBP2*s*2 is connected to the wiring WI4 in the interposer INTP via a pad, a via, and a wiring (not illustrated) provided in the region R24 of the interposer INTP. The microbumps μBP1*s*2 and μBP2*s*2 function as bumps for detecting peeling, as do the microbumps μBP1*s* and μBP2*r*.

The wiring WI4 is connected to the microbump μBP1*r*2 for reception through a via, a wiring, and a pad (not illustrated) in the interposer INTP at a position facing the end of the chip SEM1 on the side of the chip SEM2 in a planar view. The microbump μBP1*r*2 is connected to the receiving terminal of the determination circuit JDG via the pad P14, a via, and the wirings W17, W18 in the chip SEM1. The determination circuit JDG may include a sub-determination circuit connected to the wirings W11, W14 and a sub-determination circuit connected to the wirings W15, W18.

FIG. 7 illustrates an example in which the microbumps μBP2*r* and μBP2*s* and the microbumps μBP2*r*2 and μBP2*s*2, to which the determination signals are transmitted, are respectively provided at two corners corresponding to one side of the chip SEM2. However, the two transmission paths illustrated in FIG. 7 and wiring structures corresponding to the two transmission paths may be provided at the other two corners. In this case, the determination circuit JDG transmits and receives determination signals to and from the four transmission paths. As a result, the determination circuit JDG can detect a disconnection due to film peeling or cracking, etc., at all corners of the chip SEM2 where stress is easily concentrated.

As described above, in the present embodiment, similar to the above-described embodiment, a failure such as disconnection of a plurality of chips SEM1 and SEM2 can be determined by one determination circuit JDG. Further, in the present embodiment, the determination circuit JDG can detect disconnection due to film peeling or cracking not only at the corner of the chip SEM2 adjacent to the chip SEM1 but also at the corner of the chip SEM2 on the side opposite to the chip SEM1. That is, disconnection of a plurality of transmission paths can be detected by one determination circuit JDG.

Third Embodiment

FIG. 8 illustrates an example of a semiconductor device according to the third embodiment. Elements similar to those in the above-described embodiments are denoted by the same reference numerals, and detailed descriptions thereof are omitted. In FIG. 8, as in FIG. 2, some elements such as microbumps, pads, and wiring are made transparent.

The semiconductor chips SEM1, SEM2, and SEM4 illustrated in FIG. 8 are connected to each other via the interposer INTP as in FIG. 1 and mounted on a semiconductor device 100B having a 2.5D package configuration. The mounting positions of the semiconductor chips SEM1, SEM2, and SEM4 on the interposer INTP are the same as the mounting positions of the semiconductor chips SEM1, SEM2, and SEM4 on the interposer INTP of the semiconductor device 100 illustrated in FIG. 1.

In the present embodiment, for example, the determination signal output from the determination circuit JDG returns to the determination circuit JDG via one transmission path provided in the chips SEM4 and SEM2. In comparison to FIG. 2, the determination circuit JDG can further detect the disconnection of the regions R41 and R42 adjacent to the microbump μBP4*r* at the corner of the chip SEM4. The wiring structure of the transmission path of the determination signal transmitted from the determination circuit JDG and returning to the determination circuit JDG via the microbumps μBP1*s*, μBP4*r*, μBP4*s*, μBP2*r*, μBP2*s*, and μBP1*r* is similar to the wiring structure illustrated in FIGS. 2 to 6.

The wiring structure of the chip SEM1 is similar to the wiring structure illustrated in FIG. 2, except that the regions R13 and R14 where stress is easily concentrated are set adjacent to the microbumps μBP1*r*. The wiring structures of the regions R13 and R14 are similar to the wiring structures of the regions R11 and R12 illustrated in FIG. 3.

The wiring WI1 of the interposer INTP that supplies the determination signal from the chip SEM1 to the chip SEM4, is connected to a via, a wiring, and a pad (not illustrated) provided in the region R42 of the interposer INTP that faces the corner of the chip SEM4 in a planar view. The pad (not illustrated) of the interposer INTP is connected to the microbump μBP4*r* for reception. The microbump μBP4*r* is connected to the wiring W42 through the pad P41, the via (not illustrated), and the wiring W41 provided in the region R41 of the chip SEM4. The microbump μBP4*r* functions as a bump for detecting peeling.

The wiring W42 is connected to the microbump μBP4*s* for transmission via a via and a wiring (not illustrated), and the pad P42 in the chip SEM4. The microbump μBP4*s* is connected to the wiring WI3 of the interposer INTP via a pad, a via, and a wiring (not illustrated) in the interposer INTP.

The wiring WI3 is connected to a via, a wiring, and a pad (not illustrated) in the interposer INTP in a region R22 facing the end of the chip SEM2 in a planar view. The pad is connected to the microbump μBP2*r* for reception. The microbump μBP2*r* is connected to the wiring W21 via the pad P21, and a via and a wiring (not illustrated), provided in the region R21 of the chip SEM2. The micro bump μBP2*r* functions as a bump for detecting peeling.

The wiring W21 is connected to the microbump μBP2*s* for transmission via a via and a wiring (not illustrated), and the pad P22 in the chip SEM2. The micro bump μBP2*s* is connected to the wiring WI2 of the interposer INTP via a pad, a via, and a wiring (not illustrated) in the interposer INTP. The wiring structure from the wiring WI2 to the wiring W14 is the same as that in FIG. 2. The wiring WI3 connecting the chips SEM4 and SEM2 to each other may overlap with the wirings W42 and W21 in a planar view, but in FIG. 8, the positions in a planar view are shifted for clarity.

In the semiconductor device 100B illustrated in FIG. 8, the disconnection caused by film peeling or cracking, etc., at the corners of the two chips SEM4 and SEM2 can be detected by one determination circuit JDG mounted on the chip SEM1. The transmission path and wiring structure of the determination signal illustrated in FIG. 8 may be applied between the chips SEM3 and SEM5 and the chip SEM1 illustrated in FIG. 1. The transmission path of the determination signal may be from the chip SEM1 and back to the chip SEM1 via three or more chips SEM. Further, as illustrated in FIG. 7, the transmission path of the determination signal may include microbumps μBP provided at a plurality of corners of each chip SEM. In this case, the transmission path may be a one-stroke wiring path or may have a plurality of one-stroke paths.

As described above, the same effect as the above-described embodiments can be obtained in the present embodiment. For example, the disconnection of the plurality of chips SEM1, SEM2, SEM4 and the interposer due to film peeling or cracking can be detected by one determination circuit JDG mounted on the chip SEM1.

In the above-described embodiments, the microbumps μBP included in the transmission path of the determination signal are not limited to the microbumps μBP located at the corners of the semiconductor chip SEM. For example, if a position at which film peeling or cracking is likely to occur is determined by a reliability test or the like, the microbumps μBP provided near this position may be included in the transmission path of the determination signal.

The semiconductor devices 100, 100A, and 100B are not limited to semiconductor devices operating as a system, and may be semiconductor devices used only for reliability evaluation.

Although the present invention has been described based on the above embodiments, the present invention is not limited to the specific embodiments described in the detailed description, and variations and modifications may be made and appropriately defined according to the application form, without departing from the scope of the present invention.

What is claimed is:

1. A semiconductor device comprising:

a substrate; and a plurality of semiconductor elements each including a first terminal and a second terminal connected to the substrate, and an internal wiring connecting the first terminal and the second terminal to each other, wherein a wiring path is provided to sequentially connect the plurality of semiconductor elements, by connecting the first terminal of each of the plurality of semiconductor elements to the second terminal of another one of the plurality of semiconductor elements via a substrate wiring provided in the substrate, one of the plurality of semiconductor elements includes a determination circuit provided on a path of the internal wiring, the determination circuit is configured to transmit a determination signal to the first terminal, and determine an abnormality of the wiring path based on the determination signal received by the second terminal via the wiring path, each of the plurality of semiconductor elements includes a plurality of element wiring layers, and the internal wiring includes:

first wirings connected to each other via a via provided between the element wiring layers, in two or more of the plurality of element wiring layers, second wirings connected to each other via a via provided between the element wiring layers, in two or more of the plurality of element wiring layers, and third wirings connecting the first wiring to the second wiring, the third wirings being provided in the element wiring layer that is adjacent to the element wiring layer in which the first wiring and the second wiring are provided, on a side opposite to the substrate, and the first wiring is electrically connected to the first terminal, and the second wiring is electrically connected to the second terminal.

2. The semiconductor device according to claim 1, wherein the first wiring is provided at a position facing the first terminal in a planar view, and the second wiring is provided at a position facing the second terminal in a planar view.

3. The semiconductor device according to claim 1, wherein in at least one of the plurality of semiconductor elements, at least one of a plurality of the vias connecting the plurality of the first wirings to each other or the plurality of the vias connecting the plurality of the second wirings to each other, are arranged at positions that are alternately shifted in a planar view.

4. The semiconductor device according to claim 3, wherein at least one of the plurality of the first wirings or the plurality of the second wirings that are connected to the vias that are arranged at the positions that are alternately shifted in a planar view, are L-shaped wirings having an L-shape in a planar view, the via, which is connected to the L-shaped wiring on a side of the substrate, is arranged on one end side of the L-shaped wiring, and the via, which is connected to the L-shaped wiring on a side opposite to the substrate, is arranged on another end side of the L-shaped wiring.

5. The semiconductor device according to claim 4, wherein the plurality of L-shaped wirings provided in the plurality of element wiring layers are arranged at positions facing each other in a planar view.

6. The semiconductor device according to claim 4, wherein a wiring structure having a spiral shape is provided by the L-shaped wirings provided in the plurality of element wiring layers and the vias connecting the L-shaped wirings.

7. The semiconductor device according to claim 1, wherein the substrate includes a plurality of substrate wiring layers, the substrate wiring includes fourth wirings connected to each other via a via provided between the substrate wiring layers, in two or more of the plurality of substrate wiring layers, fifth wirings connected to each other via a via provided between the substrate wiring layers, in two or more of the plurality of substrate wiring layers, and sixth wirings connecting the fourth wiring to the fifth wiring, the sixth wirings being provided in the substrate wiring layer that is adjacent to the substrate wiring layer in which the fourth wiring and the fifth wiring are provided, on a side opposite to the plurality of semiconductor elements, and wherein the fourth wiring is electrically connected to the first terminal, and the fifth wiring is electrically connected to the second terminal.

8. The semiconductor device according to claim 1, wherein in each of the plurality of semiconductor elements, at least one of the first terminal or the second terminal is provided at a corner of the semiconductor element in a planar view.

9. A semiconductor device comprising:

a substrate; and a plurality of semiconductor elements each including a first terminal and a second terminal connected to the substrate, and an internal wiring connecting the first terminal and the second terminal to each other, wherein a wiring path is provided to sequentially connect the plurality of semiconductor elements, by connecting the first terminal of each of the plurality of semiconductor elements to the second terminal of another one of the plurality of semiconductor elements via a substrate wiring provided in the substrate, one of the plurality of semiconductor elements includes a determination circuit provided on a path of the internal wiring, the determination circuit is configured to transmit a determination signal to the first terminal, and determine an abnormality of the wiring path based on the determination signal received by the second terminal via the wiring path, the substrate includes a plurality of substrate wiring layers, the substrate wiring includes:

first wirings connected to each other via a via provided between the substrate wiring layers, in two or more of the plurality of substrate wiring layers, second wirings connected to each other via a via provided between the substrate wiring layers, in two or more of the plurality of substrate wiring layers, and third wirings connecting the first wiring to the second wiring, the third wirings being provided in the substrate wiring layer that is adjacent to the substrate wiring layer in which the first wiring and the second wiring are provided, on a side opposite to the plurality of semiconductor elements, and wherein the first wiring is electrically connected to the first terminal, and the second wiring is electrically connected to the second terminal.

* * * * *